United States Patent [19]

Sakai et al.

[11] Patent Number: 5,038,351
[45] Date of Patent: Aug. 6, 1991

[54] CODED MARK INVERSION BLOCK SYNCHRONIZATION CIRCUIT

[75] Inventors: Kazutaka Sakai, Zama; Yoshihiro Ashi, Yokohama, both of Japan

[73] Assignee: Hitachi, Ltd., Tokyo, Japan

[21] Appl. No.: 339,813

[22] Filed: Apr. 18, 1989

[30] Foreign Application Priority Data

Apr. 20, 1988 [JP] Japan .................................. 63-95484

[51] Int. Cl.[5] ........................ H04L 7/00; G06F 13/42
[52] U.S. Cl. ..................................... 371/47.1; 375/20; 375/110
[58] Field of Search ...................... 371/47.1, 6, 55, 53, 371/49.1, 12, 57.2, 56, 22.6; 364/200 MS File, 900 MS File; 375/20, 110, 87

[56] References Cited

U.S. PATENT DOCUMENTS

| | | | |
|---|---|---|---|
| 3,838,214 | 9/1974 | Lind | 375/20 |
| 4,562,422 | 12/1985 | Pospischil | 375/87 |
| 4,761,635 | 8/1988 | Arnaune et al. | 371/53 |
| 4,783,786 | 11/1988 | Tsukakoshi | 371/31 |
| 4,808,970 | 2/1989 | Arnaune | 341/73 |

FOREIGN PATENT DOCUMENTS 6268336 3/1987 Japan .

Primary Examiner—Jerry Smith
Assistant Examiner—Ly V. Hua
Attorney, Agent, or Firm—Antonelli, Terry, Stout & Kraus

[57] ABSTRACT

A CMI block synchronization circuit includes a clock deriving circuit, CMI decoding circuit, signal selection determining circuit and a selection circuit. In the clock deriving circuit, a clock $CLK_o$ having the same phase as a binary signal and a clock $CLK_\pi$ having a phase which is different 180° from the clock $CLK_o$ are derived from an inputted CMI code signal. In the CMI decoding circuit, the inputted CMI code signal is decoded by using the clocks derived and violating bits are detected. In the signal selection determining circuit, the clocks $CLK_o$ and $CLK_\pi$ are counted respectively. Only when one of the count values is equal to or higher than a setting value and another count value is lower than another setting value is it regarded that a block asynchronization is caused in decoding the CMI code signal. In this case, the decoded output being selected until that time is changed over to another decoded output, whereby the block synchronization is retained even during burst errors.

2 Claims, 3 Drawing Sheets

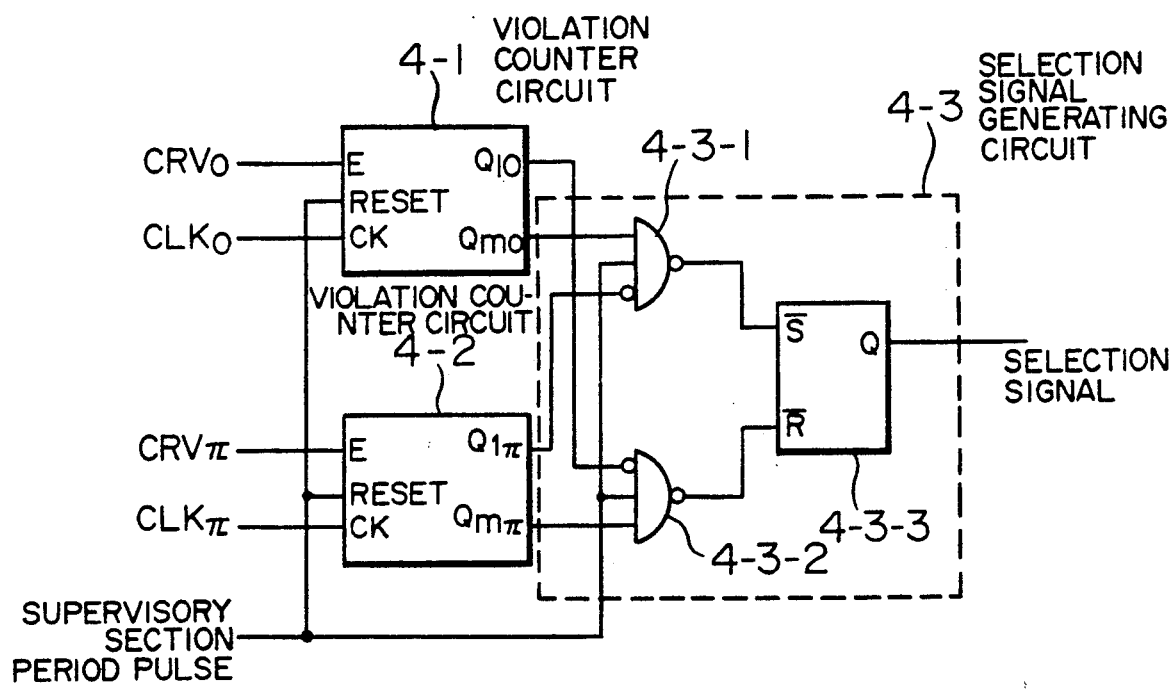

CODED MARK INVERSION BLOCK SYNCHRONIZATION CIRCUIT

BACKGROUND OF THE INVENTION

The present invention relates to a CMI (Coded Mark Inversion) block synchronization circuit capable of easily preserving block synchronization not only for random errors of inputted CMI codes but also for burst errors.

A CMI code has the configuration that one bit of a binary code is assigned two bits. A binary code "1" is represented by one of alternatively repeated "00" and "11", whereas "0" of a binary code is represented by either "01" or "10". Two bits of a CMI code indicating one bit of a binary code is called a "block". Clocks having the same period as the block period are used for decoding a CMI code into an original binary code. However, depending upon selection of either 0-phase clocks or $\pi$-phase clocks at the initial condition, there may occur a failure of synchronization.

In order to solve the above-described problem, conventionally as disclosed in Japanese Patent Laid-open Publication JP-A-62-68336, the number of violating bits within one frame is counted, and if the count becomes equal to or larger than a setting value, then block asynchronization is considered to have occurred so that clocks are inverted, i.e., clocks 180 degrees shifted from presently used clocks are selected for preserving of synchronization.

Clocks are inverted upon generation of violating bits due to random errors of inputted CMI codes because such violating bits are considered to be block asynchronization even if block synchronization is being held. Such a case is regarded as an erroneous synchronization. A probability of the erroneous synchronization of a block is represented by $P_{BERR}$. However, according to the above-described technique, such erroneous synchronization can be dealt with by properly determining the setting value, taking into consideration the following approximated equation of a block erroneous synchronization probability which is given by:

$P_{BERR} = {}_NC_K \times (m/2 \times Pe)^K$ where N is the number of bits within a supervisory section, K is a setting value of violating bit number, m is a mark rate, Pe is a data error rate for binary codes, and C represents a combination in mathematics where $${}_NC_K = \frac{N!}{(N-K)! \times K!}$$

The above technique, however, has not considered block synchronization preservation against burst errors of inputted CMI codes, resulting in erroneous synchronization. Further in such a case, it takes time corresponding to one supervisory section to recover synchronization, thus causing a lose of data.

SUMMARY OF THE INVENTION

It is an object of the present invention to provide a CMI block synchronization circuit capable of preserving block synchronization even upon burst errors of inputted CMI codes.

The above object can be achieved in such a manner that violating bits of inputted CMI codes are detected and counted within a supervisory section in synchronism with 0-phase and 180 degrees shifted $\pi$-phase clocks respectively derived from the inputted CMI codes, and only when one of the count values is equal to or larger than a setting value and the other is smaller than the setting value, is block asynchronization is considered to have occurred to thereby switch the presently selected decoded output to the other one.

0-phase and 180 degrees shifted $\pi$-phase clocks are derived out of inputted CMI codes. In synchronism with these derived clocks, the inputted CMI codes are decoded separately and independently. While decoding the inputted CMI codes, rule violating bits thereof are detected and counted within a supervisory section. Assuming that block synchronization is being held on one of the two types of clocks, the count value of violating bits may become equal to or larger than a setting value upon occurrence of burst errors of inputted CMI codes. However, in such a case, block synchronization is not being held on the other clock when the count value of violating bits also become equal to or larger than the setting value. Therefore block asynchronization is not effected and the decoded output is not switched to the other output.

BRIEF DESCRIPTION OF THE DRAWINGS

FIG. 3A is a block diagram showing an example of the circuit arrangement of the main part of the circuit of FIG. 2, and FIG. 3B is a logic table illustrating the operation of the circuit of FIG. 2.

DESCRIPTION OF THE PREFERRED EMBODIMENTS

The embodiment of the present invention will be described with reference to FIGS. 1 to 3B.

Figure 2:
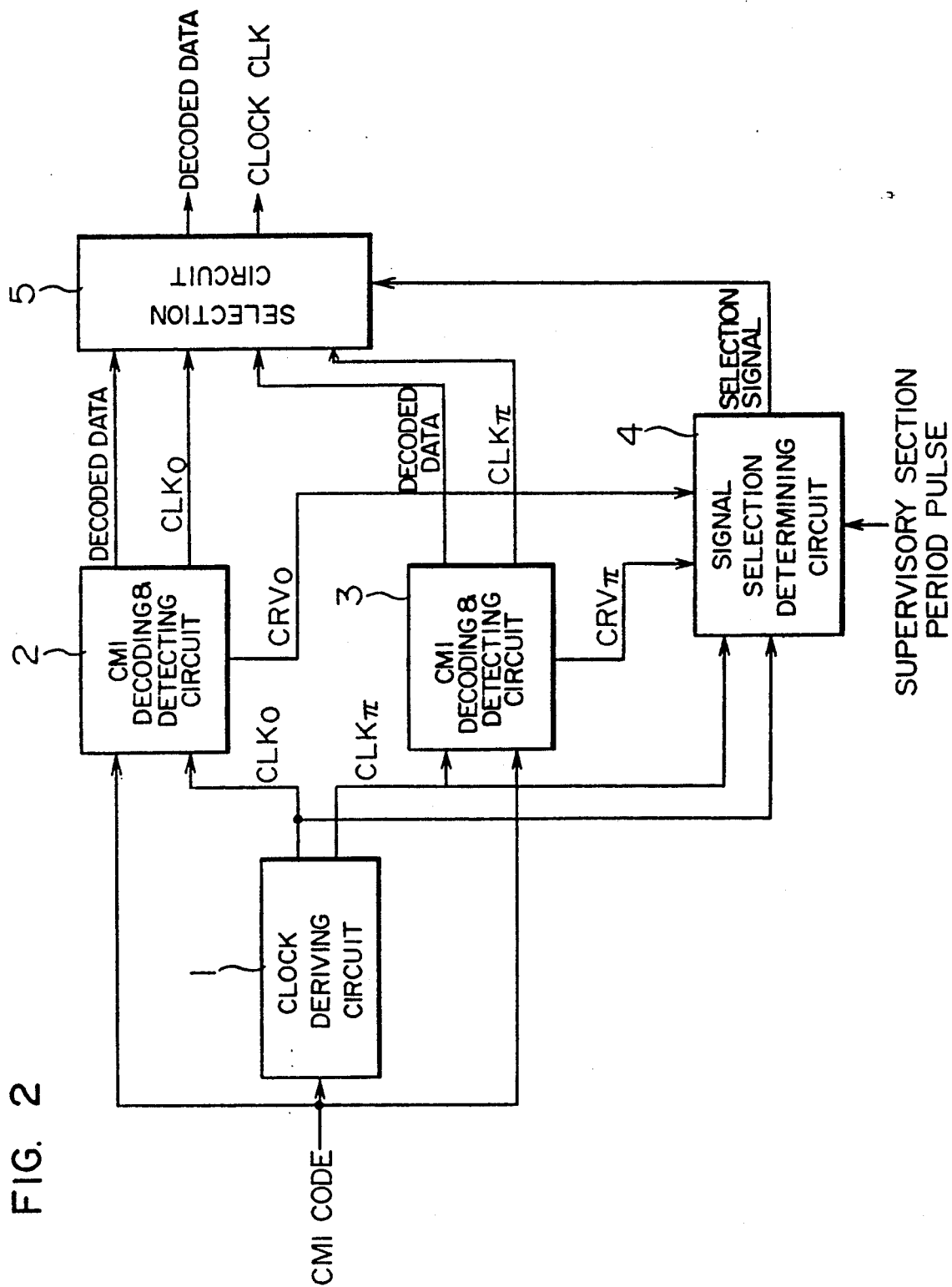
FIG. 2 is a block diagram showing the outline of an exemplary CMI block synchronization circuit according to the present invention.

The CMI clock synchronization circuit of this invention will be described first. FIG. 2 is a block diagram showing the outline of an example of the circuit. In this circuit, a clock deriving circuit 1 derives, from inputted CMI codes, 0-phase clocks $CLK_0$ having the same period as the bit period of binary codes, and 180 degrees shifted $\pi$-phase clocks $CLK_\pi$. The inputted CMI codes are decoded separately and independently in synchronism with these clocks $CLK_0$ and $CLK_\pi$. In synchronism with 0-phase clocks $CLK_0$, a CMI decoding and detecting circuit 2 decodes the inputted CMI codes, and detects violating (coding rule violating) bits from the inputted CMI codes to obtain a violating bit detection signal $CRV_0$ which is in turn counted by a signal selection determining circuit 4. Similarly, a violating bit detection signal $CRV_\pi$ obtained by a CMI decoding and detecting circuit 3 in synchronism with $\pi$-phase clocks $CLK_\pi$ is counted by the signal selection determining circuit 4. The signal selection determining circuit 4 counts the violating bit detection signals $CRV_0$ and $CRV_\pi$ independently and separately within each supervisory section. In accordance with the count results at the end of each supervisory section, a selection circuit 5 is controlled to selectively deliver a coded output.

FIG. 3A is an example of the signal selection determining circuit 4. In this circuit, violation counter circuits 4-1 and 4-2 are enabled by the violating bit detection signals $CRV_0$ and $CRV_\pi$ from the CMI decoding and detecting circuits 2 and 3. During the enabled state, the violation counter circuits 4-1 and 4-2 count the clocks $CLK_0$ and $CLK_\pi$, and are reset upon reception of a supervisory section period pulse indicative of the start and end of a supervisory section predetermined as desired. Therefore, at the end of each supervisory section, the number of violating bits within the section can be obtained as the count value of each counter circuit. The $Q_{10}$ and $Q_{1\pi}$ outputs of the violation counter circuits 4-1 and 4-2 become "High" level when the count value is 1 or larger, and the $Q_{m0}$ and $Q_{m\pi}$ outputs thereof become "High" level when the count value becomes equal to or larger than a predetermined setting value m. Outputs of the violation counter circuits 4-1 and 4-2 are received by a selection signal generating circuit 4-3 at each timing of the supervisory section period pulses. A determination is made in the selection signal generating circuit 4-2 based on the outputs of the violation counter circuits 4-1 and 4-2, which of the clocks $CLK_0$ and $CLK_\pi$ are to be selected. The determination is output as a selection signal which controls the selection circuit 5 shown in FIG. 2.

In the selection signal generating circuit 4-3, a NAND gate 4-3-1 detects a condition that the violating bit number at the CMI decoding and detecting circuit 2 is equal to or larger than the setting value m and that the violating bit number at the CMI decoding and detecting circuit 3 is 0. A detection output from the NAND gate 4-3-1 sets an RS flip-flop 4-3-3. Similarly, a NAND gate 4-3-2 detects a condition that the violating bit number at the CMI decoding and detecting circuit 3 is equal to or larger than the setting value m and that the violating bit number at the CMI decoding and detecting circuit 2 is 0. A detection output from the NAND-gate 4-3-2 resets the RS flip-flop 4-3-3.

In summary, the selection signal is outputted as the Q output of the RS flip-flop 4-3-3 as shown in Table of FIG. 3B. The RS flip-flop 4-3-3 does not change its state at conditions other than those shown in Table, so that the conditions of the selection signal at the previous supervisory section are maintained unchanged if a condition causing a change does not occur. A selection signal obtained as stated above is supplied to the selection circuit 5. If the selection signal is a "Low" level, selected are the decoded data and 0-phase clocks $CLK_0$ from the CMI decoding and detecting circuit 2, and if on the contrary the selection signal is a "High" level, selected are the decoded data and $\pi$-phase clocks $CLK_\pi$ from the CMI decoding and detecting circuit 3.

Consequently, assuming that block synchronization is being held on 0-phase clocks $CLK_0$, then the selection signal takes a "Low" level. In this condition, even if violating bits are generated due to random errors of inputted CMI codes, the synchronization can be preserved by properly determining the m value, on condition that the violating bit number is smaller than the setting value m so that the $Q_{m0}$ output takes a "Low" level and hence the selection signal remains unchanged. Further, even if violating bits are generated due to burst errors of inputted CMI codes and the number of violating bits becomes equal to or larger then m and hence the $Q_{m0}$ output takes a "High" level, the selection signal remains unchanged and has the previous condition because the block synchronization $\pi$-phase clocks has not been established from the beginning and the $Q_{1\pi}$ output takes a "High" level. As stated above, even for burst errors of inputted CMI codes, the block synchronization can be preserved.

Figure 1:
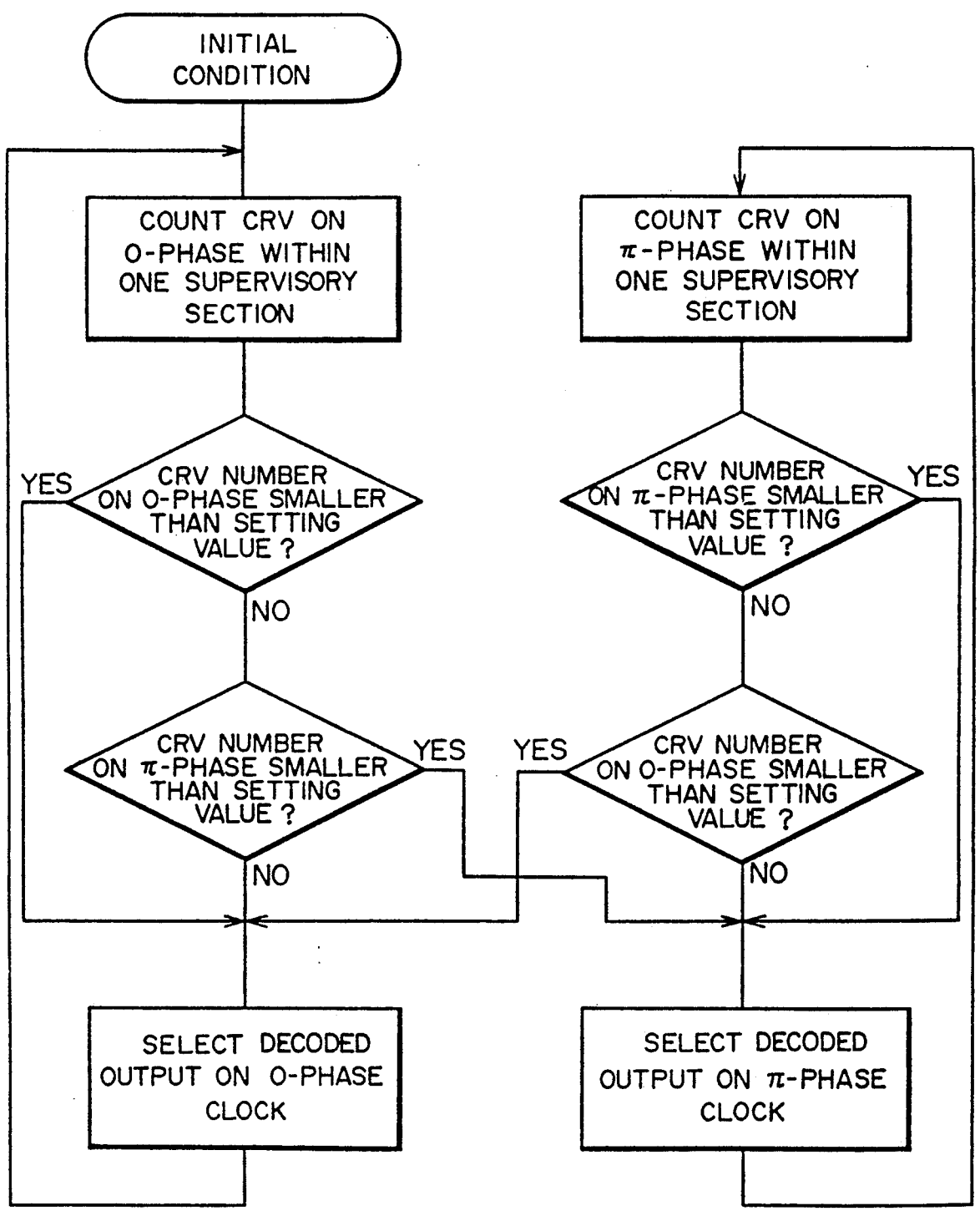
FIG. 1 is a flow chart illustrating an algorithm of selecting a decoded output according to the present invention.

FIG. 1 illustrates an operation algorithm of the invention. Since the algorithm can be understood easily based on the foregoing description of the embodiment, it will not be explained.

We claim:

1. A CMI block synchronization circuit comprising:
   clock deriving means for deriving, from an inputted CMI code, a first clock having a period substantially identical to a bit period of a binary code from said inputted CMI code and a second clock having a phase difference of 180 degrees from said inputted CMI code;
   first decoding and detecting means for decoding said inputted CMI code on the basis of said first clock and detecting first violating bits from said inputted CMI code;
   second decoding and detecting means for decoding said inputted CMI code on the basis of said second clock and detecting second violating bits from said inputted CMI code;
   selection means for selecting one of decoded signals outputted from said first and second decoding and detecting means;
   means for individually counting said first and second violating bits from said first and second decoding and detecting means and comparing individual counts of said first and second violating bits with respective setting values; and
   signal selection determining means for causing said selection means to select one of said decoded signals, when one of said individual counts of said first and second violating bits is equal to or higher than its respective setting value and the other one of said individual counts of said first and second violating bits is lower than its respective setting value.

2. A CMI block synchronization method comprising the steps of:
   deriving, from an inputted CMI code, a first clock having a period substantially identical to a bit period of a binary code from a second clock having a phase difference of 180 degrees from said first clock;
   obtaining decoded signals by decoding said inputted CMI code on the basis of said first and second clocks;
   detecting and counting violating bits of said decoded signals in each of a plurality of supervisory sections;
   comparing counts of said violating bits with respective setting values; and
   selecting and outputting a decoded signal on the basis of said second clock, when a count of violating bits of said decoded signal on the basis of said first clock is equal to or larger than a setting value and a count of violating bits of the other decoded signal on the basis of said second clock is lower than the other setting value.

* * * * *